(12) United States Patent
Goodwin

(10) Patent No.: US 8,493,546 B2
(45) Date of Patent: Jul. 23, 2013

(54) PLASMA AS A BAND PASS FILTER FOR PHOTO LITHOGRAPHY

(75) Inventor: Francis Goodwin, Clifton Park, NY (US)

(73) Assignee: Sematech, Inc., Austin, TX (US)

( * ) Notice: Subject to any disclaimer, the term of this patent is extended or adjusted under 35 U.S.C. 154(b) by 789 days.

(21) Appl. No.: 12/644,591

(22) Filed: Dec. 22, 2009

(65) Prior Publication Data

US 2011/0149260 A1  Jun. 23, 2011

(51) Int. Cl.
G03B 27/42 (2006.01)
(52) U.S. Cl.
USPC .................................. 355/53; 355/67; 355/77
(58) Field of Classification Search
USPC ................................................ 355/53, 67, 77
See application file for complete search history.

(56) References Cited

U.S. PATENT DOCUMENTS

2008/0239269 A1* 10/2008 LaFontaine et al. ............ 355/67

OTHER PUBLICATIONS

Borg et al., "An overview of plasma research," 23 AINSE Plasma Science and Technology Conference held in association with the 14th Australian Institute for Physics Conference, *Conference Handbook*, p. 16, 2000.
Bijerk et al., "Debris mitigation & EUV absorption issues in the plasma environment," Presentation given at EUVL Source Workshop, ISMT, Dallas, Oct. 14, 2002.
Fernalser, "Production of large-area plasmas by electron beams," *Physics of Plasmas*, 5(5):2137-43, 1998.
Herschcovitch et al., "A plasma window or transmission of particle beams and radiation from vacuum to atmosphere for various applications," *Physics of Plasma*, 5(5):2130, 1998.
Herschcovitch et al., "Air boring and nonvacuum electron beam welding with a plasma window," *Physics of Plasma*, 12(5):057102, 2005.
Herschcovitch et al., "High-pressure arcs as vacuum—atmosphere interface and plasma lens for nonvacuum electron beam welding machines, electron beam melting and nonvacuum ion material modification," *J. Appl. Phys.*, 78(9):5283-5288, 1995.
Hershcovitch, "Non-vacuum electron beam welding through a plasma window," *Nuclear Instruments and Methods in Physics Research B*, 241:854-857, 2005.
Kren, "New 'Window' of Opportunity for E-Beam Welding," *Machine Design*, 2004.
Krushelnick et al., "Laser plasma acceleration of electron: Towards the production of monoenergetic beams," *Physics of Plasma*, 12(5), 056711, 2005.
Manheimer et al., "Theoretical Aspects of the Agile Mirror," *Naval Research Laboratory*, Jan. 5, 1994.
Manheimer, "Theoretical Aspects of the Enhanced Glow Discharge," Naval Research Laboratory, May 16, 19997.

(Continued)

*Primary Examiner* — Toan Ton
*Assistant Examiner* — Mesfin T Asfaw
(74) *Attorney, Agent, or Firm* — Fulbright & Jaworski LLP

(57) ABSTRACT

A band pass filter includes a first electrode, a second electrode, and a plasma generated by the first and second electrode. The plasma is confined to a region of space through which electromagnetic waves having a frequency above an intrinsic plasma frequency are transmitted, and electromagnetic waves having a frequency below the intrinsic plasma frequency are reflected. The band pass filter may be implemented in a photo lithography tool between a source module and an exposure module. The plasma of the band pass filter may be adapted to reduce IR radiation (or other out of band radiation) exposure to the exposure module by reflecting IR radiation back to the radiation source. In an extreme ultraviolet photo lithography tool, the plasma of the band pass filter may be adapted to transmit EUV radiation.

20 Claims, 3 Drawing Sheets

OTHER PUBLICATIONS

Manheimer, "Theoretical Overview of the Large Area Plasma Processing System (LAPPS)," *Naval Research Laboratory*, Apr. 17, 2000.

Murphy et al., "Evidence of Photon acceleration by laser wake fields," *Physics of Plasmas*, 13(3): 033108, 2006.

Okuno, "Production of sheet plasma with dc magnetron discharge source," *Rev. Sci. Intum.*, 63(1):44-47, 1992.

Pinkoski et al., "X-ray transmission through a plasma window," *Review of Scientifc Instruments*, 72(3):1677-79, 2001.

Raparia et al., "Plasma Window for SNS Target," Collider-Accelerator Department, Brookhaven National Laboratory, 2002.

Reitsma et al., "Phototon kinetic modeling of laser pulse propagation in underdense plasma," *Physics of Plasmas*, 13(11): 113104, 2006.

Salerno et al., "Windowless targets for intense beams," *Nuclear Instruments and Methods in Physics Research A*, 469:13-20, 2001.

Teresko, "Plasma Window Developed for High-Quality Electron Beam Welding in Atmosphere," *Welding Journal*, 20-21, 2005.

Teresko, "Plasma Window Reinvents Electron Beam Welding," *Industry Week*, 2004.

Uramoto, "Simple Method of Sheet Plasma Production in Lower Pressure," *National Institute for Fusion Science*, 1-11, 1983.

* cited by examiner

PLASMA AS A BAND PASS FILTER FOR PHOTO LITHOGRAPHY

BACKGROUND OF THE INVENTION

1. Field of the Invention

The present disclosure generally relates to semiconductor manufacturing processes. More specifically, the present disclosure relates to a band pass filter for radiation in a photo lithography tool.

2. Description of Related Art

Integrated circuits (ICs), such as microprocessors and memory devices, include millions of interconnected semiconductor components such as transistors and capacitors. Sizes of these components have decreased over time to reduce cost of manufacturing, provide additional capabilities, and/or reduce power consumption. Solutions for manufacturing components at smaller sizes focuses on producing smaller feature sizes during photo lithography. Conventionally, in photo lithography, a light source illuminates a mask containing patterns that build the components. Optics reduce the patterns to the desired size, which illuminate a photosensitive material deposited on material stacks that are later processed into semiconductor components.

A minimum feature size produced by a photo lithography process is related, by the Raleigh equation, to $k_1 \lambda /NA$, where $k_1$ is a process dependant variable, $\lambda$ is the wavelength of the light source, and NA is the numerical aperture of the projection lens. Conventional light sources include an ArF laser, which produces ultraviolet (UV) light with a wavelength of 193 nm. Tools with ArF laser light sources manufacture ICs with feature sizes of 65 nm and 45 nm. One proposal for further reducing feature size includes tools having an extreme ultraviolet (EUV) light source, at a wavelength of approximately 13.5 nm, and therefore a higher resolution capable of imaging smaller features.

Light sources, such as EUV sources, produce additional out-of-band (OOB) radiation at wavelengths outside the desired wavelength for lithography. Specifically, light sources may produce infrared (IR) radiation. IR radiation propagates through the exposure tool heating components in the IC manufacturing process. Heating of components may result in shorter lifespan of the components. Shorter lifespan of lithography tools leads to undesirable costs for the manufacturer, as lithography tools often cost tens of millions of dollars. Additionally, the IR radiation may heat masks used during exposure resulting in damage to the masks or lower achievable resolutions of a lithography tool by reducing the contrast of the images coming off of the mask.

SUMMARY OF THE INVENTION

According to one aspect of the disclosure, a band pass filter includes a first electrode at a first voltage. The band pass filter also includes a second electrode at a second voltage. The band pass filter further includes a gas source. The band pass filter yet also includes a plasma confined to a region of space between the first electrode and the second electrode. The plasma has an intrinsic plasma frequency. The plasma is generated by the first electrode, the second electrode, and the gas source. The plasma transmits electromagnetic waves above the intrinsic plasma frequency and reflects electromagnetic waves below the intrinsic plasma frequency.

According to another aspect of the disclosure, a photo lithography tool, includes a light source that generates electromagnetic waves. The photo lithography tool also includes an exposure module that exposes wafers with at least a portion of the electromagnetic waves. The photo lithography tool yet also includes a band pass filter interposed between the light source and the exposure module to filter a portion of the electromagnetic waves. The band pass filter includes a first electrode at a first voltage. The band pass filter also includes a second electrode at a second voltage. The band pass filter further includes a gas source. The band pass filter yet also includes a plasma confined to a region of space between the first electrode and the second electrode. The plasma has an intrinsic plasma frequency. The plasma is generated by the first electrode, the second electrode, and the gas source. The plasma transmits electromagnetic waves above the intrinsic plasma frequency and reflects electromagnetic waves below the intrinsic plasma frequency.

According to yet another aspect of the disclosure, a method of filtering electromagnetic waves includes generating a plasma having an intrinsic plasma frequency. The plasma transmits electromagnetic waves above the intrinsic plasma frequency and reflects electromagnetic waves below the intrinsic plasma frequency. The method also includes tuning parameters of the plasma to select a desired plasma frequency based, in part, on a desired first group of electromagnetic waves for transmission and a desired second group of electromagnetic waves for reflection.

The foregoing has outlined rather broadly the features and technical advantages of the present disclosure in order that the detailed description that follows may be better understood. Additional features and advantages will be described hereinafter which form the subject of the claims of the disclosure. It should be appreciated by those skilled in the art that the conception and specific embodiments disclosed may be readily utilized as a basis for modifying or designing other structures for carrying out the same purposes of the present disclosure. It should also be realized by those skilled in the art that such equivalent constructions do not depart from the technology of the disclosure as set forth in the appended claims. The novel features which are believed to be characteristic of the disclosure, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present disclosure.

The term "band-pass filter" is defined as a filter that passes frequencies within a certain frequency range and attenuates frequencies outside of that range.

The term "coupled" is defined as connected, although not necessarily directly, and not necessarily mechanically.

The terms "a" and "an" are defined as one or more unless this disclosure explicitly requires otherwise.

The term "substantially" and its variations are defined as being largely but not necessarily wholly what is specified as understood by one of ordinary skill in the art, and in one non-limiting embodiment "substantially" refers to ranges within 10%, preferably within 5%, more preferably within 1%, and most preferably within 0.5% of what is specified.

The terms "comprise" (and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

Other features and associated advantages will become apparent with reference to the following detailed description of specific embodiments in connection with the accompanying drawings.

BRIEF DESCRIPTION OF THE DRAWINGS

For a more complete understanding of the present disclosure, reference is now made to the following description taken in conjunction with the accompanying drawings.

DETAILED DESCRIPTION

Various features and advantageous details are explained more fully with reference to the non-limiting embodiments that are illustrated in the accompanying drawings and detailed in the following description. Descriptions of well known starting materials, processing techniques, components, and equipment are omitted so as not to unnecessarily obscure the invention in detail. It should be understood, however, that the detailed description and the specific examples, while indicating embodiments of the invention, are given by way of illustration only, and not by way of limitation. Various substitutions, modifications, additions, and/or rearrangements within the spirit and/or scope of the underlying inventive concept will become apparent to those skilled in the art from this disclosure.

A filter may be applied between a light source and a exposure path of a lithography tool to remove out-of-band (OOB) radiation produced in the light source. Thus, the filter may prevent some or all of the OOB radiation from entering the exposure path and affecting other components in the lithography tool. According to one embodiment, the filter may be a plasma that reflects OOB radiation and transmits desired radiation to the exposure path.

Figure 1:
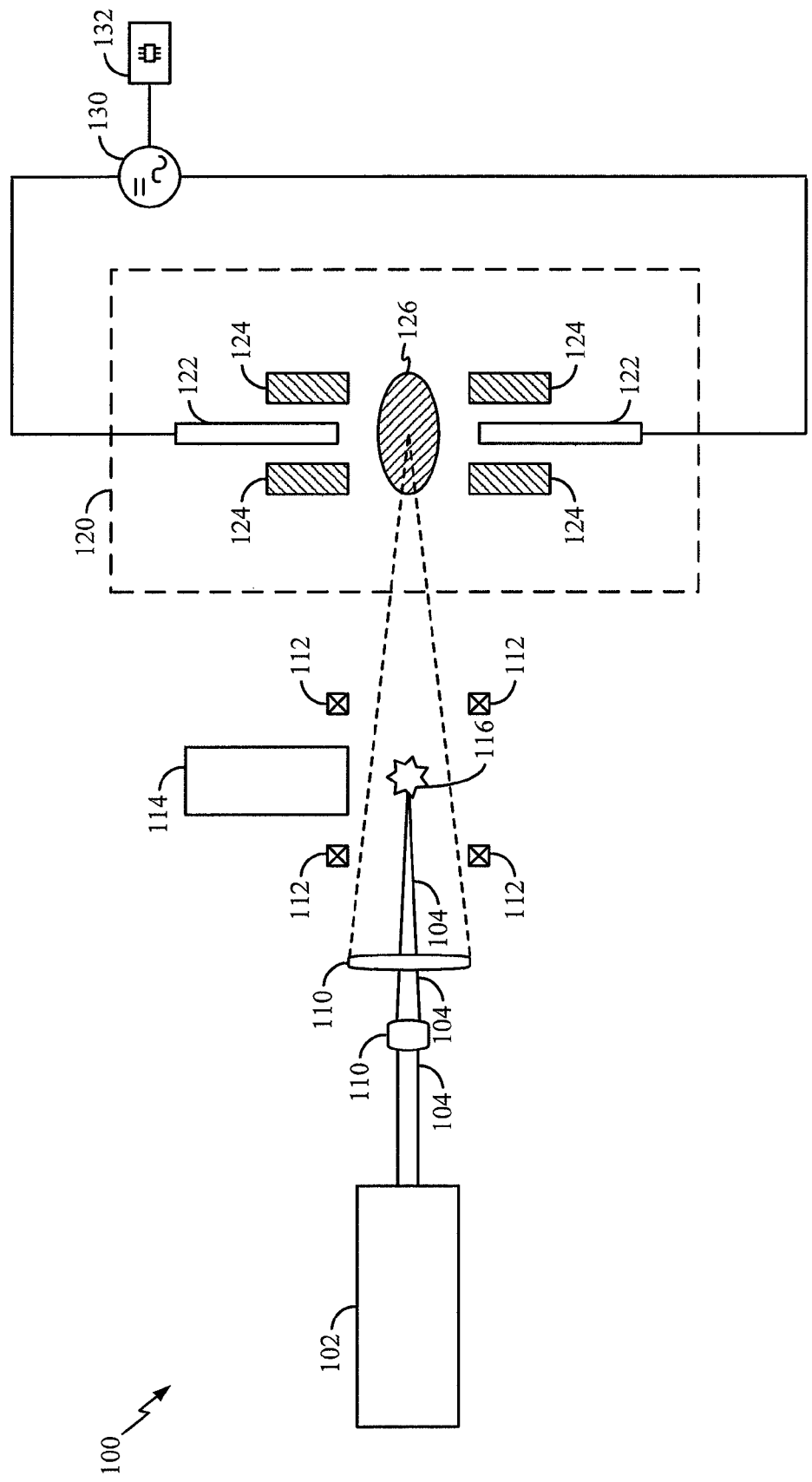
FIG. 1 is a cross-sectional view of an light source having a plasma as a band pass filter according to one embodiment.

FIG. 1 is a cross-sectional view of an light source having a plasma as a band pass filter according to one embodiment. A light source 100 includes a laser 102 and a target supply 114. According to one embodiment, the light source 100 may include a laser produced plasma (LPP) extreme ultraviolet (EUV) light source. In this embodiment, the laser 102 may be a pulsed carbon dioxide ($CO_2$) laser, and the target supply 114 may produce tin (Sn) droplets. The laser 102 produces a light beam 104. The light beam 104 may be focused using optics 110. The optics 110 focus the laser beam 104 to a desired spot size and may include any number of optics devices including refractive and reflective elements and concave and convex elements. The light beam 104 strikes a droplet 116 produced by the target supply 114. Irradiation of the droplet 116 by the light beam 104 may produce radiation, and according to one embodiment produces extreme ultraviolet radiation (EUV), which has a wavelength of approximately 5-120 nanometers. In one embodiment, the droplet 116 is tin, and the EUV radiation produced has a wavelength of approximately 13.5 nm. According to one embodiment, magnets 112 may be placed in the light source 100 around the target supply 114 to steer and control the trajectory of the droplet 116 into the path of the light beam 104 of the laser 102.

In addition to desired radiation, OOB radiation is produced by the laser 102 and irradiation of the droplet 116. The OOB radiation is undesirable and results in adverse behavior of components in a lithography tool as described above. A band pass filter 120 may be placed in a lithography tool in the path of radiation produced by irradiation of the droplet 116 to remove selected wavelengths of radiation. Band pass filtering may be accomplished by a plasma 126.

The plasma 126 may be produced using electrodes 122. A gas (not shown) may be injected in proximity to the electrodes 122. A voltage applied to the electrodes 122 causes ionization of the gas and formation of the plasma 126. According to one embodiment, magnets 124 may be used to confine the plasma 126 to a region of space substantially between the electrodes 122. The magnets 124 may be electromagnets controlled by an external controller (not shown), such as a microcontroller. Thus, the region of space occupied by the plasma 126 may be controlled in situ.

The voltage applied by the electrodes 122 may be generated by a voltage supply 130. The voltage supply 130 may be either a direct current (DC) or a radio frequency (RF) voltage source. According to one embodiment, the voltage supply 130 may be controlled by a controller 132, such as a microcontroller. The controller 132 may be programmed to maintain a desired voltage on the electrodes 122 or to vary in time the voltage applied to the electrode 122 to obtain desired characteristics of the plasma 126, such as described below.

Electrical properties of the plasma 126 are derived, in part, from the motion of free electrons in the plasma 126. For example, the relative dielectric constant, $\in_R$, of the plasma 126 may be determined from $\in_R = 1 - \omega_P^2/\omega^2$, where $\omega$ is the operating circular frequency, and $\omega_P$ is the intrinsic plasma frequency. The intrinsic plasma frequency, $\omega_P$, is given by $\eta_e e^2/m_e$, where $\eta_e$ is the plasma electron density, e is the electronic charge constant, and $m_e$ is the mass of an electron. The plasma 126 interacts with electromagnetic waves (radiation) passing through the plasma 126. For example, for frequencies above the intrinsic plasma frequency, $\omega_P$, substantially all electromagnetic waves are transmitted with a wavelength of $\lambda/\in_R$, where $\lambda$ is the free space wavelength of the electromagnetic waves, and $\in_R$ is the relative dielectric constant of the plasma 126. In another example, for frequencies below the intrinsic plasma frequency, $\omega_P$, the plasma 126 has a negative dielectric constant resulting in metal-like behavior that reflects some or all of the electromagnetic waves.

In one embodiment the plasma 126 may be tuned to reflect some or all OOB radiation and transmit substantially all wavelengths at a desired frequency. The plasma 126 absorbs little to none of incident electromagnetic waves with frequencies above the intrinsic frequency of the plasma. Thus, the plasma 126 is an effective band pass filter. For example, in an EUV light source, the plasma 126 may be tuned to transmit substantially all EUV radiation and reflect some or all IR radiation. A band pass filter 120 designed to filter IR radiation may be referred to as a heat shield. The plasma 126 may be tuned by, for example, selection of the gas or gas mixture, and/or controlling the pressure of the plasma. Pressure of the plasma 126 may be controlled in one embodiment by magnetic confinement. Stronger magnetic confinement creates a higher partial pressure on the plasma. Of course, any voltage, pressure, or gas may be used in the plasma 126.

The infrared part of the electromagnetic spectrum covers the range from approximately 300 GHz (1 mm) to 400 THz (750 nm). According to one embodiment, a plasma 126 may be generated with an intrinsic plasma frequency of approximately $5 \times 10^{16}$ Hz to block wavelengths of 180 nm to 200 nm and above.

The magnets 124 may be used in another embodiment to tune parameters of the plasma 126. For example, by changing the region of the space the plasma 126 occupies, the plasma electron density, $\eta_e$, may be adjusted. As discussed above, the plasma electron density, $\eta_e$, affects the intrinsic plasma frequency, $\omega_P$. Additionally, the plasma electron density, $\eta_e$, may change an effective depth of the plasma 126. Thus, in one embodiment, the plasma electron density, $\eta_e$, may be tuned to reduce absorption of transmitted electromagnetic waves in the plasma 126.

According to one embodiment, the plasma 126 is placed at an intermediate focus (IF) of the optics 110. At the intermediate focus the EUV radiation is confined to a small area. A small confinement area for the EUV radiation may reduce the amount of space over which the plasma uniformity may be controlled.

Figure 2:
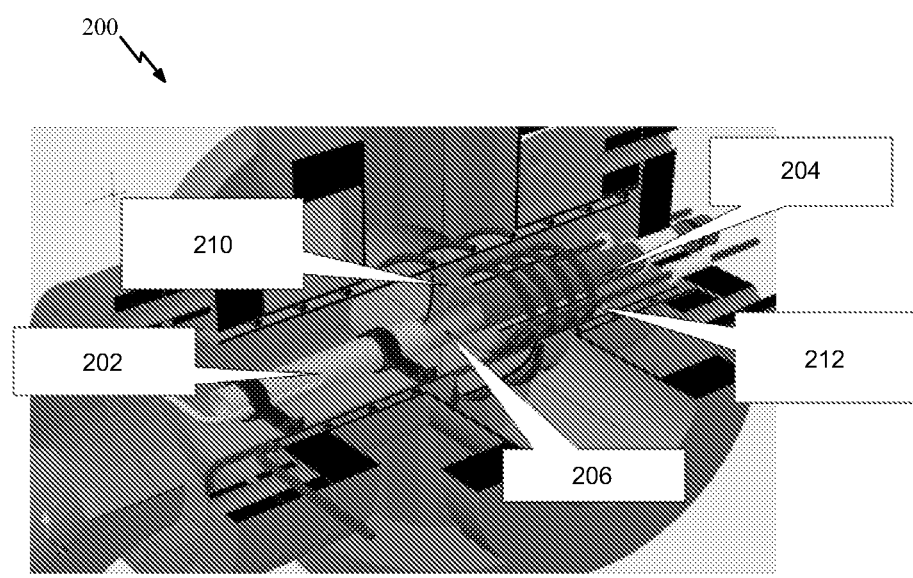
FIG. 2 is a schematic of a plasma band pass filter according to one embodiment.

The band pass filter 120 illustrated in FIG. 1 may be implemented in a physical design of FIG. 2. FIG. 2 is a schematic of a plasma band pass filter according to one embodiment. A band pass filter 200 includes a plasma 206. As described above, the plasma 206 may be tuned to pass substantially all radiation of desired wavelengths and substantially reflect some or all OOB radiation. The plasma 206 is formed between a cathode 204 and an anode 202. The cathode 204 may be coupled to a voltage supply (not shown) that establishes an electric field between the cathode 204 and the anode 202 to ionize gas substantially between the cathode 204 and the anode 202. A controller (not shown) may be coupled to the voltage supply and the cathode 204 for tuning the plasma 206. According to one embodiment, magnetic coils (not shown) are placed in proximity to the cathode 204 and the anode 202 to confine the plasma 206 to a region of space, such as substantially between the anode 202 and the cathode 204.

Power supplied to the cathode 204 may generate undesirable heat. According to one embodiment, a heat shield 210 may be placed proximal to the cathode 204. For example, the heat shield 210 may be a hollow cylinder that substantially surrounds the cathode 204. According to another embodiment, additional cooling may be achieved with cooling lines 212. The cooling lines 212 filled with water may be placed proximal to the heat shield 210. Water in the cooling lines 212 carries heat away from the heat shield 210 and the cathode 204.

Figure 3:
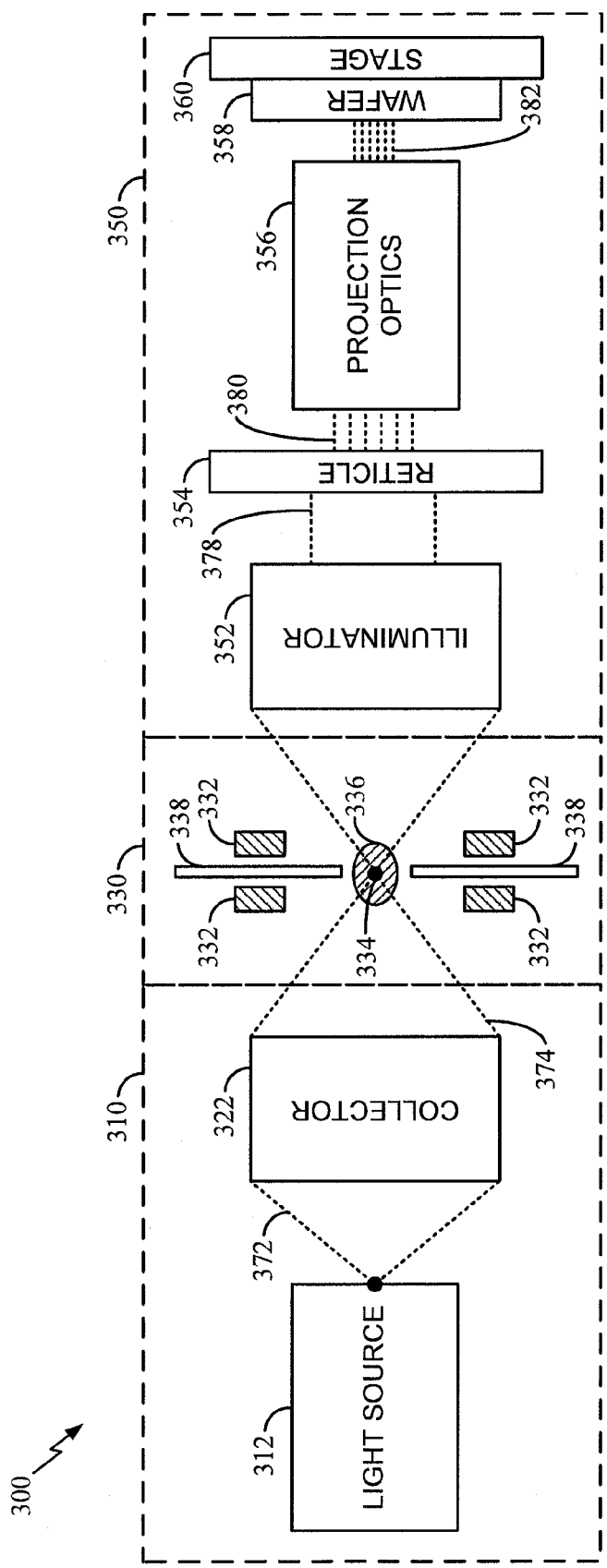
FIG. 3 is a block diagram illustrating a photo lithography tool having a plasma as a band pass filter according to one embodiment.

A light source with a band pass filter may be implemented in a lithography tool as shown in FIG. 3. FIG. 3 is a block diagram illustrating a photo lithography tool having a plasma as a band pass filter according to one embodiment. A photo lithography tool 300 includes a source-collector module 310 and an exposure module 350. The source-collector module 310 includes a light source 312, such as a LPP EUV source. Light 372 from the light source 312 enters a collector 322 for focusing. The collector 322 projects light 374 to an intermediate focus point 334. According to one embodiment the intermediate focus point 334 is at an aperture into the exposure module 350 and located inside a band pass filter 330.

The band pass filter 330 includes electrodes 338, which when excited by a voltage source in the presence of a gas flow produces a plasma 336. The plasma 336 may be tuned to substantially transmit electromagnetic radiation of a desired wavelength and reflects some or all OOB radiation. According to one embodiment, the band pass filter 330 is configured to reflect some or all IR radiation produced by the light source 312. In this embodiment, the band pass filter 330 prevents IR radiation from entering the exposure tool and heating the components of the exposure module 350. Reducing heat in the exposure module 350 may prolong component life and increase resolution of the exposure module 350. According to another embodiment, the plasma 336 may be confined to a region of space by magnetic fields generated by magnets 332. The region of space may be located substantially between the electrodes 338.

A portion of light 374 transmitted through the band pass filter 330 enters an illuminator 352. The illuminator 352 passes light 378 to a reticle 354 containing patterns for a lithography process. Patterned light 380 transmits through portions of the reticle 354 into projection optics 356. The projection optics 356 magnifies or de-magnifies the patterned light 380 from the reticle 354. A stage 360 carries a target for exposure by the photo lithography tool 300. Although a transmissive reticle or mask is illustrated, a reflective reticle or mask may also be placed between the illuminator 352 and the projection optics 356. According to one embodiment, the projection optics 356 may project magnified patterned light 382 onto a wafer 358 coated with a photosensitive material.

Placement of a band pass filter in a lithography tool between a light source and an exposure module reduces OOB radiation from reaching exposure components in the lithography tool. For example, IR radiation may be filtered using the band pass filter to act as a heat shield for the exposure components of the lithography tool. That is, reflecting some or all of the IR radiation generated by the source prevents heating of the exposure components by the IR radiation. The band pass filter may be implemented as a plasma generated by two electrodes. A voltage applied to the two electrodes may be controlled by a controller, and adjusted to determine, in part, the radiation transmitted and reflected by the plasma. A plasma operating as a band pass filter is capable of handling large incident power of electromagnetic waves because little to none of the energy of the electromagnetic waves is absorbed by the plasma.

Although the present disclosure and its advantages have been described in detail, it should be understood that various changes, substitutions and alterations can be made herein without departing from the technology of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding embodiments described herein may be utilized according to the present disclosure. Accordingly, the appended claims are intended to include within, their scope such processes, machines, manufacture, compositions of matter, means, methods, or steps.

What is claimed is:

1. A band pass filter, comprising:
 a first electrode at a first voltage;
 a second electrode at a second voltage;
 a gas source; and
 a plasma confined to a region of space between the first electrode and the second electrode and having an intrinsic plasma frequency, the plasma being generated by the first electrode, the second electrode, and the gas source and transmitting electromagnetic waves above the intrinsic plasma frequency and reflecting electromagnetic waves below the intrinsic plasma frequency;
where the band pass filter is configured to be disposed between a light source and an exposure component of a photo lithography tool.

2. The band pass filter of claim 1, further comprising a controller configured to modify the intrinsic plasma frequency.

3. The band pass filter of claim 2, the controller modifying the intrinsic plasma frequency by adjusting the first voltage of the first electrode.

4. The band pass filter of claim 2, the controller modifying the intrinsic plasma frequency by adjusting at least one of a background pressure of the plasma and at least one gas of the plasma.

5. The band pass filter of claim 1, further comprising a plurality of magnets arranged in proximity to the first electrode and the second electrode, the region of space being defined, in part, by the plurality of magnets.

6. The band pass filter of claim 5, the plurality of magnets comprising:
a plurality of electromagnets; and
a controller configured to adjust a current through the plurality of electromagnets to modify the region of space.

7. The band pass filter of claim 1, further comprising at least one heat shield proximal to the first electrode.

8. The band pass filter of claim 7, further comprising at least one cooling line proximal to the first electrode.

9. The band pass filter of claim 1, the band pass filter being integrated into an extreme ultraviolet radiation source and the intrinsic plasma frequency equal to approximately $5 \times 10^{16}$ Hertz.

10. The band pass filter of claim 9, the extreme ultraviolet radiation source being a laser produced plasma.

11. A photo lithography tool, comprising:
a light source that generates electromagnetic waves;
an exposure module that exposes wafers with at least a portion of the electromagnetic waves; and
a band pass filter being interposed between the light source and the exposure module to filter a portion of the electromagnetic waves, the band pass filter comprising:
a first electrode at a first voltage;
a second electrode at a second voltage;
a gas source; and
a plasma confined to a region of space between the first electrode and the second electrode and having an intrinsic plasma frequency, the plasma being generated by the first electrode, the second electrode, and the gas source and transmitting electromagnetic waves above the intrinsic plasma frequency and reflecting electromagnetic waves below the intrinsic plasma frequency.

12. The photo lithography tool of claim 11, the band pass filter further comprising a controller configured to control the intrinsic plasma frequency of the plasma.

13. The photo lithography tool of claim 12, in which the controller adjusts at least one of a background pressure of the plasma and at least one gas of the plasma.

14. The photo lithography tool of claim 11, the band pass filter being located proximal to an intermediate focus point of the light source.

15. The photo lithography tool of claim 11, in which the light source is a laser produced plasma extreme ultraviolet light source.

16. The photo lithography tool of claim 11, in which the band pass filter further comprises a plurality of magnets arranged in proximity to the first electrode and the second electrode, the region of space being defined, in part, by the plurality of magnets.

17. A method of filtering electromagnetic waves, comprising:
generating a plasma having an intrinsic plasma frequency, the plasma transmitting electromagnetic waves above the intrinsic plasma frequency and reflecting electromagnetic waves below the intrinsic plasma frequency;
tuning parameters of the plasma to select a desired intrinsic plasma frequency based, in part, on a desired first group of electromagnetic waves for transmission and a desired second group of electromagnetic waves for reflection;
generating electromagnetic waves to be filtered by the plasma; and
exposing a component of a photo lithography tool to filtered electromagnetic waves.

18. The method of claim 17, in which tuning parameters of the plasma comprises adjusting at least one of a gas, a background pressure, and a voltage applied to an electrode.

19. The method of claim 17, in which the desired first group of electromagnetic waves are extreme ultra violet light and the desired second group of electromagnetic waves are infrared light.

20. The method of claim 17, in which tuning parameters of the plasma comprises tuning parameters of the plasma to reflect at least some out-of-band radiation.

* * * * *